(12) United States Patent
König et al.

(10) Patent No.: US 10,775,416 B2
(45) Date of Patent: Sep. 15, 2020

(54) METHOD FOR PRODUCING A CONTACT SPACING CONVERTER AND CONTACT SPACING CONVERTER

(71) Applicant: FEINMETALL GMBH, Herrenberg (DE)

(72) Inventors: Christian König, Filderstadt (DE); Jörg Burgold, Herrenberg (DE); Gunther Böhm, Nufringen (DE); Wolfgang Schäfer, Grafenberg (DE)

(73) Assignee: FEINMETALL GMBH, Herrenberg (DE)

( * ) Notice: Subject to any disclaimer, the term of this patent is extended or adjusted under 35 U.S.C. 154(b) by 175 days.

(21) Appl. No.: 15/561,873

(22) PCT Filed: Feb. 15, 2016

(86) PCT No.: PCT/EP2016/053195
§ 371 (c)(1),
(2) Date: Sep. 26, 2017

(87) PCT Pub. No.: WO2016/155937
PCT Pub. Date: Oct. 6, 2016

(65) Prior Publication Data
US 2018/0120353 A1   May 3, 2018

(30) Foreign Application Priority Data
Mar. 31, 2015 (DE) .................. 10 2015 004 150

(51) Int. Cl.
*G01R 3/00* (2006.01)
*G01R 1/073* (2006.01)
(Continued)

(52) U.S. Cl.
CPC ............. *G01R 3/00* (2013.01); *B29C 64/10* (2017.08); *B33Y 10/00* (2014.12); *C23C 18/32* (2013.01);
(Continued)

(58) Field of Classification Search
None
See application file for complete search history.

(56) References Cited

U.S. PATENT DOCUMENTS

| | | | |
|---|---|---|---|
| 6,114,864 A * | 9/2000 | Soejima | G01R 1/07342 324/756.03 |
| 6,232,669 B1 * | 5/2001 | Khoury | G01R 1/06761 257/48 |

(Continued)

FOREIGN PATENT DOCUMENTS

| | | |
|---|---|---|
| DE | 102015206000 A1 | 10/2015 |
| EP | 0802419 A2 | 10/1997 |
| EP | 1233272 A1 | 8/2002 |

OTHER PUBLICATIONS

International Search Report for PCT/EP2016/053195, ISA/EP, Rijswijk, NL, dated May 10, 2016.

(Continued)

*Primary Examiner* — Stefanie S Wittenberg
(74) *Attorney, Agent, or Firm* — Stephen T. Olson; Harness, Dickey & Pierce, P.L.C.

(57) ABSTRACT

A method for producing a contact spacing converter space transformer) which has electrical contacts that form electrical paths and in which a first contact spacing of the contacts is converted into a comparatively different, second contact spacing of the electrical contacts including producing at least one base part from each of at least some of the electrical contacts. At least a section of the base part is produced from plastic. The method subsequently includes metallization of (Continued)

at least the section of the base part that is produced from plastic.

21 Claims, 8 Drawing Sheets

(51) Int. Cl.
- B33Y 10/00 (2015.01)
- B29C 64/10 (2017.01)
- C23C 18/32 (2006.01)
- C23C 28/02 (2006.01)
- C25D 3/12 (2006.01)
- C25D 5/48 (2006.01)
- C25D 7/00 (2006.01)

(52) U.S. Cl.
CPC .............. *C23C 28/023* (2013.01); *C25D 3/12* (2013.01); *C25D 5/48* (2013.01); *C25D 7/00* (2013.01); *G01R 1/07378* (2013.01)

(56) References Cited

U.S. PATENT DOCUMENTS

| | | | |
|---|---|---|---|
| 6,499,216 B1 | 12/2002 | Fjelstad | |
| 2001/0036718 A1* | 11/2001 | Williams | H01L 21/4857 438/597 |
| 2005/0191913 A1* | 9/2005 | Farnworth | H01R 13/2414 439/862 |
| 2006/0119376 A1* | 6/2006 | Tunaboylu | G01R 1/06711 219/121.69 |
| 2013/0234748 A1 | 9/2013 | Namburi et al. | |
| 2014/0176181 A1 | 6/2014 | Choi et al. | |
| 2015/0137848 A1* | 5/2015 | Lewinnek | G01R 31/2889 324/756.03 |
| 2015/0280346 A1* | 10/2015 | Rosenberger | H01R 43/16 439/828 |
| 2017/0023615 A1 | 1/2017 | Ekin | |

OTHER PUBLICATIONS

Written Opinion of the ISA for PCT/EP2016/053195, ISA/EP, Rijswijk, NL, dated May 10, 2016.

International Preliminary Report on Patentability (Chapter II), with nine page annex; Date of Completion Mar. 1, 2017; IPEA/EP.

Plastic Metallization—Wikipedia—Jan. 2015https://en.wikipedia.org/w/index.php?title=title&country=typicalization; Kunststoffmetallisierung—Wikipedia—Jan. 2015 https://de.wikipedia.org/w/index.php?title=Kunststoffmetallisierung&direction=next&oldid=131283140.

English Translation of the International Preliminary Report on Patentability for PCT/EP2016/053195, IB, Geneva, dated Oct. 5, 2017.

\* cited by examiner

METHOD FOR PRODUCING A CONTACT SPACING CONVERTER AND CONTACT SPACING CONVERTER

CROSS REFERENCE TO RELATED APPLICATIONS

This application is a 371 U.S. National Stage of International Application No. PCT/EP2016/053195, filed Feb. 15, 2016, which claims the benefit of and priority to German Patent Application No. 10 2015 004 150.9, filed Mar. 31, 2015. The disclosures of the above applications are incorporated herein by reference.

FIELD

The invention relates to a method for producing a contact spacing converter (space transformer) which has electrical contacts that form electrical paths and in which a first contact spacing of the contacts is converted into a comparatively different, second contact spacing of the electrical contacts.

The invention further relates to a contact spacing converter.

BACKGROUND

Various methods for producing a contact spacing converter (space transformer) are known. Within a device for electrical contacting, particularly touch-contacting, for an electrical device under test (DUT), particularly wafer, such contact spacing converters are used to create electrical paths that convert very small contact spacings into larger contact spacings. The contacts of an electrical device under test to be contacted can have very small center distances. In order to be able to touch-contact them, a contact spacing converter is required which has the electrical paths that has a very fine resolution of the center distances (grid dimension) of the contacts at one end, particularly in accordance with the DUT contact arrangement. On its other side, the contact spacing converter has a comparatively coarser resolution, so that it is possible to electrically contact additional components of the device in order to ultimately obtain a contact spacing that enables a testing device to be connected. Using the testing device, electrical current paths are connected which, along with the contact spacing converter, enable the DUT to be electrically checked for electrical functionality. The very fine resolution of the electrical paths can have center distances of the contacts between 20 μm and 500 μm, and the side of the contact spacing converter that is associated with the testing device (tester) can have a coarse resolution in the range between 200 μm and 2,600 μm. The known contact spacing transformers always contact a so-called contact head having spring contacts (bent wires, for example) that are used to touch-contact the DUT.

One noteworthy known contact spacing converter is a space transformer that is manufactured according to the wiring principle in which electrical wires perform the disentanglement (fine resolution to coarse resolution). Space transformers are also known in which electrical paths perform the disentanglement within a printed circuit board.

All known solutions have the drawback of very high costs resulting from their elaborate constructions and resulting long setup times. Due to its electrical characteristics and its construction, which must be set up manually, the design with wiring, which can be produced relatively quickly and flexibly, is not future-proof. The long wire connections lead to crosstalk, for example, and the manual construction can only be performed by highly trained employees, and the manual operation results in a relatively high error ratio.

SUMMARY

It is therefore the object of the invention to provide a method for producing a contact spacing transformer (space transformer) that results in the simple, quick, and/or cost-effective construction of such a contact spacing transformer, is associated with optimal disentanglement, has high manufacturing flexibility, renders different customer-specific requirements fulfillable, and requires short production times.

This object is achieved in the method mentioned at the outset through the following steps: Creation of at least one base part from at least several of the electrical contacts, with at least a portion of the base part being made of plastic, and subsequent metallization of the at least one portion of the base part that is made of plastic. Through the use of plastic in the manufacturing of the base part, highly complex structures can be easily produced, particularly also arranged in a volume, so that these structures can even have oblique profiles, thus enabling optimal disentanglement. In order to render these plastic structures electrically conductive, they are metallized after they are produced, whereby the electrically conductive paths are formed that are required for the routing of electrical current. The potentially very delicate plastic structures that can be produced enable a very fine resolution of the center distances (particularly grid dimension), and due to the path routing which, in particular, can be implemented freely in a volume, they enable a first contact spacing to be implemented on one side and a second contact spacing (particularly center distance) to be implemented on the other side, with the first contact spacing having appropriately different dimensioning than the second contact spacing (particularly center distance) in order to bring about disentanglement.

According to a development of the invention, a provision is made that the production of the at least one portion of the base part that is made of plastic is performed by means of an additive production process. Additive production processes, which are also referred to as "generative production processes," are to be understood particularly as fast and cost-effective processes that take place directly from shapeless materials (e.g., liquids, powders, or the like) or shape-neutral materials (e.g., belt-shaped, wire-shaped, etc.) by means of chemical and/or physical processes on the basis of internal computer data models. Although these are primary shaping processes, no special tools having the respective geometry of the workpiece (such as casting molds, for example) are necessary in order to achieve a specific result.

In particular, selective laser sintering of metal powder (SLM), a stereolithography process (SLA), a digital light process rapid prototyping method (DLP), and/or a dip-in laser lithography process (DILL) is used as an additive production process. The various processes will be addressed in further detail below.

The metallization is preferably performed using at least one galvanic and/or chemical process. A galvanic process is characterized in that electric current is used. The process of chemical deposition is also called "electroless metal deposition." In any case, metal is built up on the aforementioned plastic geometry of the base part. Preferably, a metal layer is deposited by means of the galvanic and/or chemical process. Metals such as copper, silver, gold, and nickel, as well as other metals having electrical conductivity are particularly suitable for this purpose.

According to a development of the invention, a provision is made that the entire base part is made of plastic, preferably by means of the additive production process, particularly as a one-piece base part. Each of the electrical paths is thus preferably made of plastic, particularly in a single piece.

A provision is made that the entire base part is metallized. As a result, the respective plastic path is given a metal coating that permits electrical current to be conducted during subsequent use.

According to a development of the invention, a provision is made that, before the galvanic metallization, an electrically conductive starting layer is applied to at least the portion of the base part that is made of plastic or produced on the surface of the portion. If a plastic is used that is not electrically conductive or not sufficiently so, this electrically conductive starting layer is necessary for the galvanic deposition in order to ensure the flow of electrical current during the electroplating process. Alternatively, however, an electrically conductive plastic or a plastic composite that has been provided with electrical conductivity can also be used to produce the base part.

In particular, a provision is made that, before the particularly chemical metallization, a seed layer is applied to at least the portion of the base part that is made of plastic or produced on the surface of the portion, particularly by means of a dipping or plasma process. In this way, "seeds" or "anchoring points" are created on the surface of the corresponding plastic geometry, thus enabling metallization to occur.

A provision is preferably made that, after metallization, the part made of plastic is not removed or not removed at least in some areas, particularly by means of a pyrolysis process, a wet chemical process, or a dry chemical process. As will readily be understood, it is possible to leave the plastic core—i.e., the portion of the base part or the entire base part—in place in the metal shell after metallization. As mentioned previously, it is alternatively possible to remove the plastic core from the metal shell using a suitable selective method. The previously mentioned pyrolysis process, the wet chemical process, and/or the dry chemical process is expedient for this purpose. A provision is preferably made that, as a result of metallization, a metallic coating or—as a result of the removal of the part that is made of plastic at least in some areas—a hollow metal shell is produced. Furthermore, a provision is preferably made that at least one opening is produced or left in the metallic coating/metal shell formed through metallization that has the purpose of allowing pyrolysis products to escape and/or access by at least one wet and/or dry chemical agent during the execution of the wet chemical and/or dry chemical process. The corresponding residual products can thus escape and/or access is provided to the plastic material to be removed.

According to a development of the invention, a provision is made that the contact spacing converter is composed of several converter zones, with the electrical contacts each being composed of several contact zones, each contact zone belonging to a converter zone, and each contact zone being produced in one of several successively executed manufacturing stages, with the at least one base part being produced and subsequently metallized in order to produce at least one contact zone of at least one of the converter zones. In principle, the contact spacing converter can have only one converter zone, but it preferably has several converter zones. The several converter zones serve the purpose of increasing the disentanglement from converter zone to converter zone; that is, each converter zone has, on one side, a coarser resolution of the center distances of the contact zones than on its other side. In this way, the disentanglement is increased from converter zone to converter zone. As mentioned previously, the portions of the electrical contacts of the contact spacing converter in the individual converter zones are called contact zones, while the sum of the adjacent contact zones of a contact represents the overall contact. The converter zones are built one atop the other such that electric current can be conducted along this contact—i.e., along this electrical path—and a neighboring such electrical path is electrically insulated from the first-mentioned electrical path. The converter zones are created in manufacturing stages that are to be carried out successively; in keeping with the core idea of the invention, the at least one base part is created and subsequently metallized in order to produce at least one contact zone of at least one of the converter zones.

According to a development of the invention, a provision is made that the contact spacing of the contacts at one end of each contact zone is created so as to have a different spacing interval than the contact spacing of the contacts at another end of this contact zone. With regard to the spacing interval, a provision is made that these are the previously mentioned center distances, with the contacts preferably being arranged in a uniform grid, so that the grid dimension is produced that was already mentioned above.

According to a development of the invention, a provision is made that one of the additive processes is applied to at least one of the contact zones during manufacturing.

According to a development of the invention, a provision is made that, during the manufacturing of the electrical contacts that are composed of several contact zones, each of the contact zones of each contact is produced by means of another of the additive methods. Consequently, a method for creating the different contact zones is used, with each contact zone of a contact being preferably produced using another of these methods. Alternatively, it is also conceivable for neighboring contact zones to be produced using the same additive method.

According to a development of the invention, a provision is made that, in an intermediate method step, at least one of the converter zones is produced with a supporting structure that stabilizes the respective contact zones of the contacts. This is to be understood such that the very delicate contact zones are interconnected by means of the supporting structure in order to be stabilized. This occurs in the pre-metallized state; that is, the contact zones that are connected by the supporting structure are made of plastic. Metallization is performed only later, with the supporting structure being removed beforehand such that the contact zones no longer have any connection between each other, thus preventing short circuits.

Furthermore, a provision is preferably made that the supporting structure is created by means of additive production processes, particularly with the contact zones. Reference is made in this context to the various methods of claim 3. In particular, the supporting structure is also created during the creation of the contact zones, so that the individual electrical paths of the contact zones are given a sufficiently stable construction by virtue of the supporting structure, so that contacts between contact zones are prevented; after all, these contacts would result in an electrical short circuit later, namely as soon as metallization has been performed and the DUT is employed in the testing process. As a result of the simultaneous creation of the supporting structure with the contact zones, no additional method step is required; rather, the two components can be produced together in the same method step.

According to a development of the invention, a provision is made that the ends of the contacts of the contact zone is provided with the supporting structure, particularly interconnected by means of same. There, it is not necessary for the supporting structure to be produced over the length of the contact zones, but rather it is sufficient to provide only the ends of the contacts with this supporting structure, with these ends being those having the finer resolution and/or the coarser resolution, particularly advantageously the fine resolution.

According to a development of the invention, a provision is made that at least one of the converter zones is embedded in hardening, electrically nonconductive casting compound. The casting compound stabilizes the contact zones in this converter zone. Due to the electrically nonconductive property of the casting compound, no electrical short circuits occur. As will readily be understood, the casting compound can also be added only after the contact zones are electrically conductive, i.e., when they have been metallized.

A development of the invention makes a provision that, through the removal of a portion of the casting compound, the ends of the contact zones of the respective contacts are laid bare, optionally after the removal of the supporting structure or a portion thereof. The casting compound is thus removed in the area of the ends of the contact zones, so that the contact zones are laid bare and can be connected to contact zones of an adjacent converter zone and/or act as a contact, particularly a touch-contact.

According to a development of the invention, a provision is made that, after the removal of a portion of the casting compound, at least one additional converter zone is created thereon. This was already addressed briefly above.

The invention further relates to a contact spacing converter that is produced according to one of the methods as described above.

When mention is made over the course of this application of a spring contact and/or a spring contact pin, this is to be understood as a resilient contact but not only a very specific design—for example one in which a spring-loaded plunger that can be displaced in a tubular casing has a contact tip or the like projecting out of the casing. For these two terms, a very general interpretation of a contact that is resiliently flexible and/or supported in a resiliently flexible manner, etc., should therefore be applied.

DETAILED DESCRIPTION

The drawings illustrate the invention on the basis of exemplary embodiments.

Figure 1:
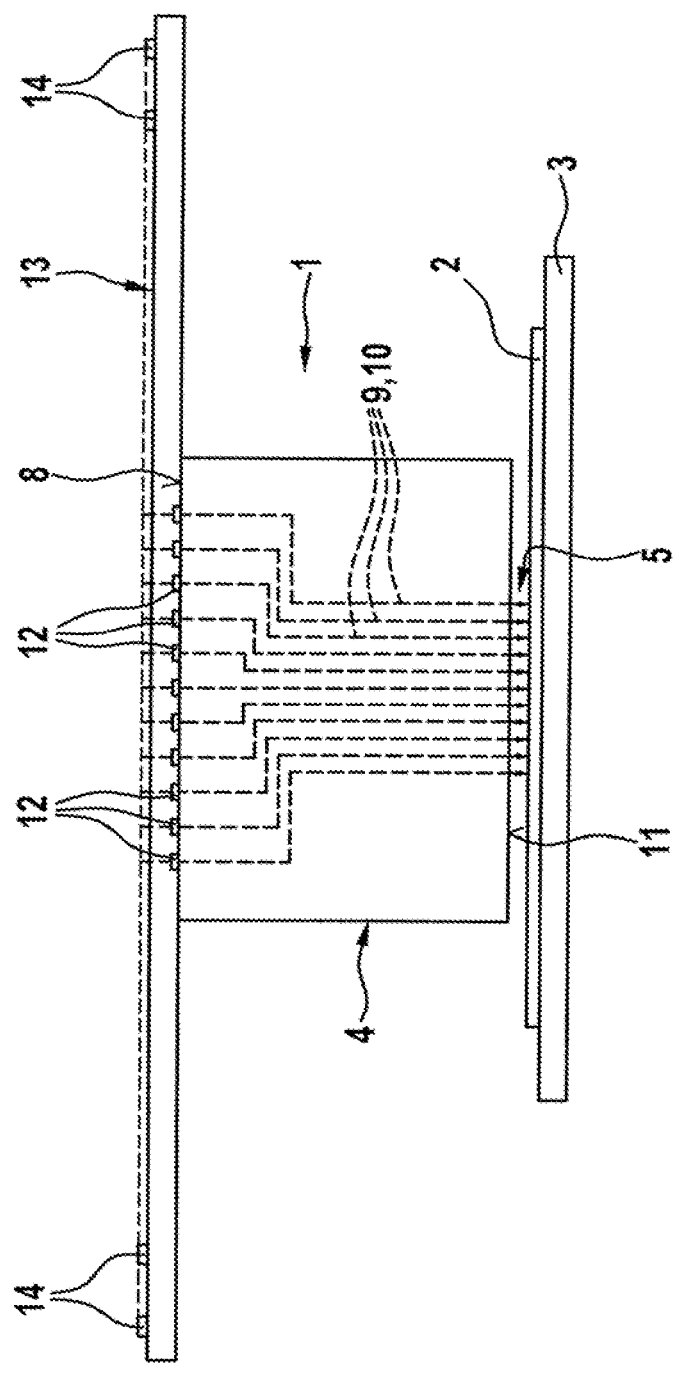
FIG. 1 shows a schematic view of a device for electrically touch-contacting an electrical device under test (DUT), particularly a wafer, with a contact spacing converter.

According to FIG. 1, the device 1 for electrically touch-contacting for testing an electrical DUT 2, particularly wafer, that is located on an underlay 3 has a contact spacing converter 4 (space transformer) and a printed circuit board 13. The contact spacing converter 4 has projecting spring contact pins 5 that are placed onto the DUT 2 contacts 6 of the DUT 2 during testing of same. The spring contact pins 5, which are disposed in the manner of a grid so as to span a plane, have a contact spacing 7 in relation to one another that is very small. This means that a very fine resolution is present that is converted into a coarser resolution by means of the contact spacing converter 4. The coarser resolution is present on the side 8 of the contact spacing converter 4 that faces away from the DUT 2. For example, the center distances of the DUT 2 contacts can be 20 µm, and the center distances on the side 8 can be 600 µm, for example. In order to perform this "disentanglement," the contact spacing converter 4 has electrical contacts 9 which form electrical paths 10 and extend from a side 11 of the contact spacing converter 4 that faces toward the DUT 2 to the side 8, which faces away from the DUT 2. On the one hand, the electrical paths 10 are electrically connected to the spring contact pins 5 and, on the other hand, to contact surfaces 12 of the printed circuit board 13, which is associated with the side 8 of the contact spacing converter 4. Starting from the contact surfaces 12, electrical conductive paths extend within and/or preferably on the printed circuit board 13 to contact surfaces 14 that are arranged peripherally on the printed circuit board 13, whereby an additional disentanglement of the contact spacings occurs. The contact surfaces 14 are connected by means of electrical cables to a testing device (tester; not shown) to which electric current paths can be connected in order to test the electrical DUT 2 for functionality.

Figure 2:
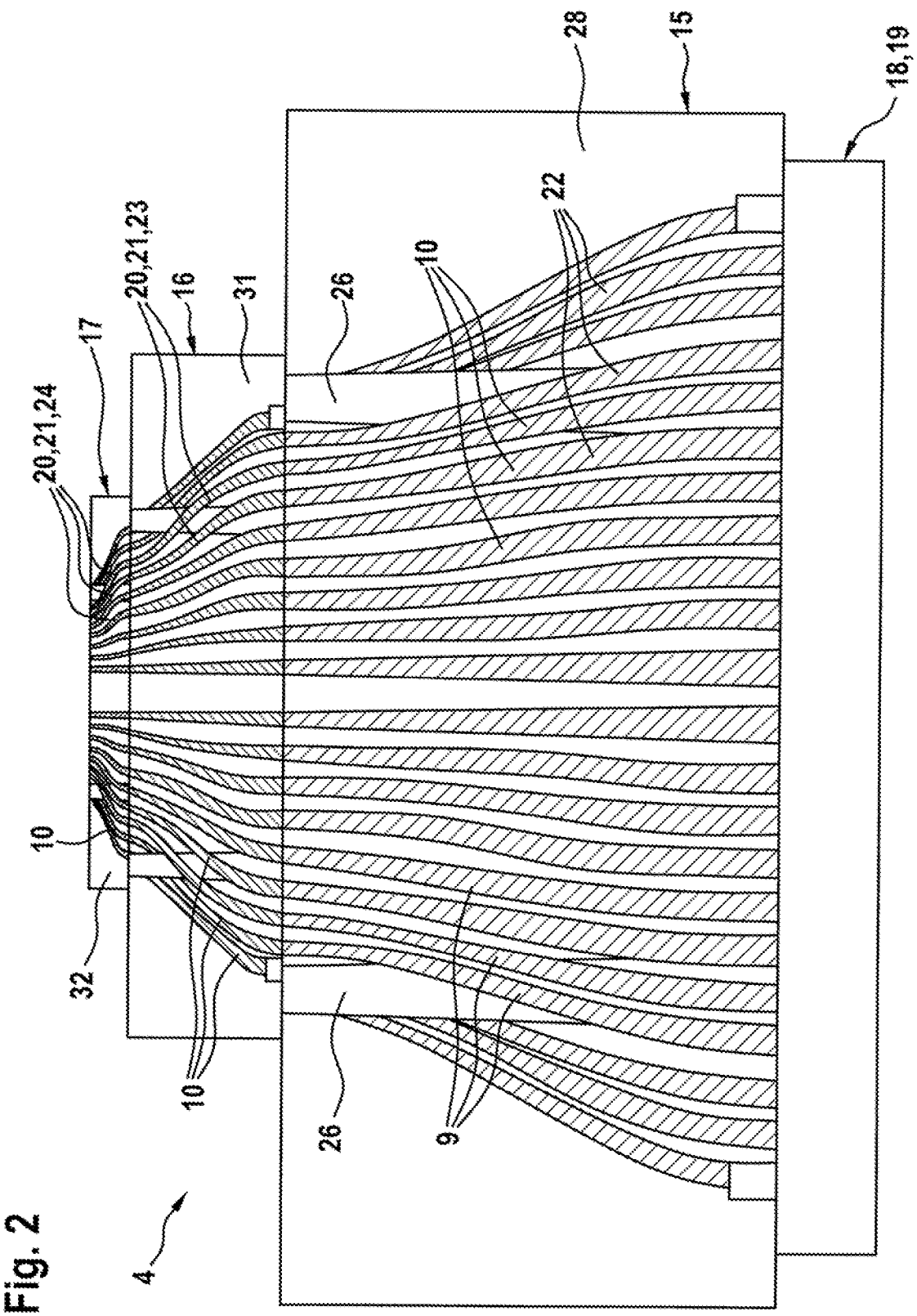
FIG. 2 shows a schematic representation of a contact spacing converter.

The contact spacing converter 4, which is shown only schematically in FIG. 1, is explained in more detail in FIG. 2 in an illustration that is more specific but still schematic to the greatest possible extent. Furthermore, it should be noted with respect to FIG. 2 that the contact spacing converter 4 illustrated therein is not yet completed; in other words, an intermediate manufacturing stage is shown.

The contact spacing converter 4 shown in FIG. 2 is composed of several, specifically three converter zones 15, 16, and 17 in the depicted exemplary embodiment, with each converter zone 15, 16, 17 performing a disentanglement with respect to the contact spacings, with the disentanglement of a converter zone (15, for example) being taken up and continued by the following converter zone (namely the converter zone 16) and passed on (namely to the converter zone 17), which also performs its disentanglement, so that, when seen over the three converter zones 15 to 17, a very effective disentanglement is achieved overall in which the very fine resolution of the electrical paths 10 is converted into a very coarse resolution, or vice versa. In principle, the contact spacing converter 4 according to the invention can also consist of only one converter zone, or several converter zones can be present, with three converter zones being shown in the exemplary embodiment of FIG. 2. Exemplary embodiments with two converter zones or more than three converter zones can also be implemented. In the following, we will successively address the production of the converter zone 15, then of the converter zone 16 and then converter zone 17—that is, from the coarse resolution to the fine resolution. The production of the multizone contact spacing converter 4 occurs in this sequence.

In order to produce the converter zone 15, an additive production process is first used to create a portion of the contacts 9 forming the electrical paths 10 on a basic structure 18, which can be embodied as a base plate 19. It is also possible in principle for the basic structure 18 to be created by means of the additive production process. Alternatively, however, a provision can also be made that basic structure 18 is produced in a different way and then used as a substrate for the construction of the contacts 9 occurring there. Since the converter zone 15 is electrical paths 10 in a relatively coarse resolution, a suitable additive production process is selected. According to one option, a base part 20 made of plastic is first produced for each path. This base part 20 is subsequently metallized, that is, provided with a metallic coating. The areas of the contacts 9 in the converter zones 16 and 17 are produced in an analogous manner. In the specific exemplary embodiment of FIG. 2, however, alternatively to the foregoing, a different option with respect to the converter zone 15 is pursued, namely the creation of the corresponding areas of the contacts 9 by means of the selective laser sintering of metal powder (SLM). This is also an additive production process. Since a respective electrical path 10 is created as a result of the sintering of the metal powder that is electrically conductive due to the metal, a metallic coating can be dispensed with. During the selective laser sintering of the metal powder, a respective layer of the metal powder is selectively fused (sintered). In this way, the portions of the electrical contacts 9 are created from many stacked layers. These portions are referred to in the following as contact zones 22 of the contacts 9. The converter zone 16 also has corresponding contact zones, which are designated by 23, and the same applies analogously to the converter zone 15, in which the areas of the contacts 9 are designated as contact zones 24. The mutually adjacent and electrically interconnected contact zones 22 to 24 thus collectively constitute the electrical contacts 9 and, accordingly, the electrical paths 10.

During the abovementioned selective laser sintering of metal powder for the purpose of creating the contact zones 22, a new layer of metal powder must be applied after each sintering step, for example by means of a doctor blade, and then fused by means of the laser. Besides stainless steels, tungsten, molybdenum, or silver alloys in particular can also be used as a metal powder material. Tungsten, molybdenum, and/or silver alloys are especially suitable for the invention due to their good electrical characteristics. The selective sintering process that is used is especially well suited to the creation of the coarse resolution because metallic material is used, meaning that electrical conductivity is given from the outset, and relatively large volumes can be produced. Since the relatively low resolution is present in the converter zone 15, this process is suitable, since very fine resolutions cannot be reliably produced. By virtue of the abovementioned doctoring process, oblique structures can be achieved in relation to the plane of the base plate 19 whose oblique profile (angle) is greater than 45° in relation to this plane. As can be seen from FIG. 2, the curved profiles of the individual contact zones 22 can thus be realized without any difficulty.

Figure 3:
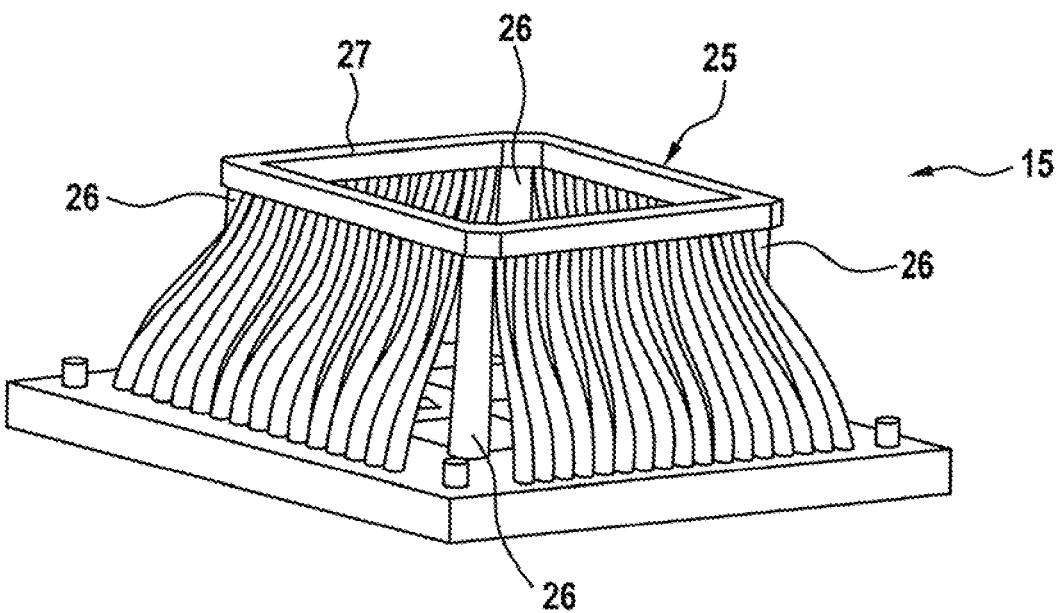
FIGS. 3 to 5 show schematic representations of a converter zone of the contact spacing converter in various production phases.
Figure 4:
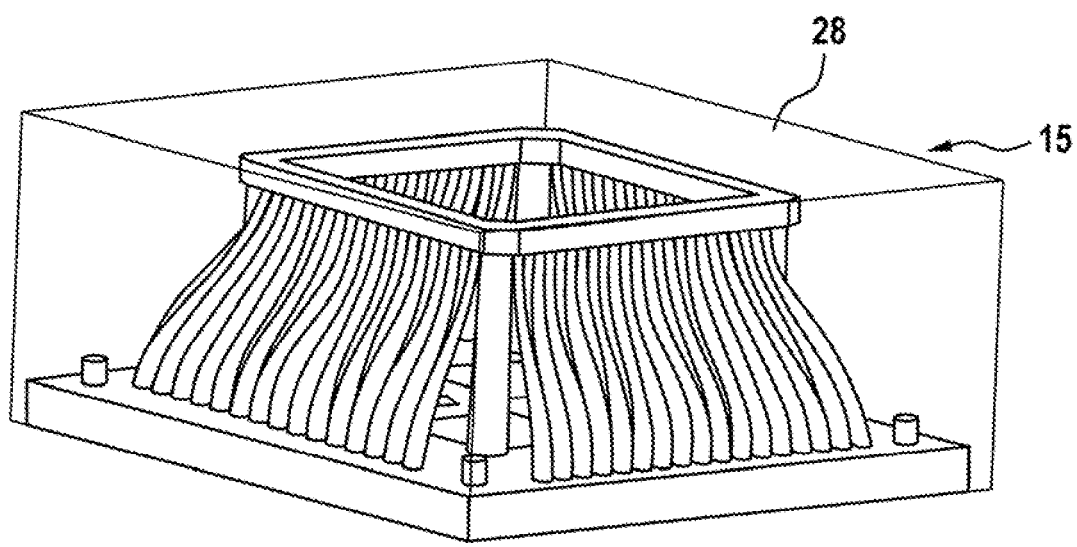
Figure 5:
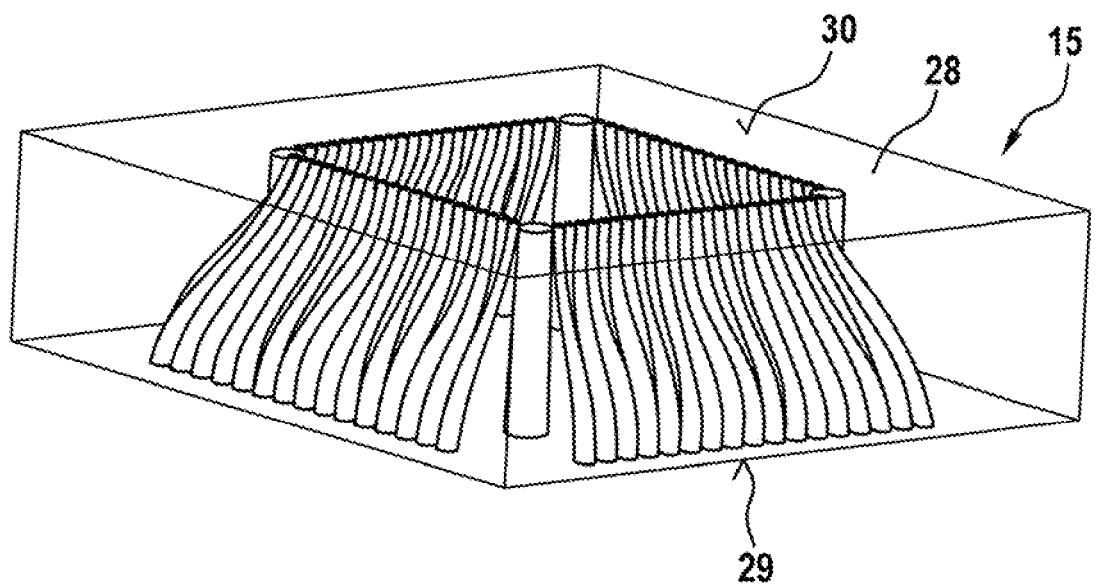

FIGS. 3 to 5 provide a detailed clarification of the creation of the converter zone 15; that is, further production steps are explained on the basis of these figures that do not follow from FIG. 2. FIG. 3 shows that, in addition to the contact zones 22 on the basic structure 18, an additional supporting structure 25 is produced. This supporting structure 25 is also produced in the additive production process, namely also through the selective laser sintering of metal powder (SLM)—in other words: Both the contact zones 22 and the supporting structure 25 are produced simultaneously. According to FIG. 3, the supporting structure 25 has several supporting columns 26 that are connected at their ends by means of a ring structure 27, which also belongs to the supporting structure 25. Furthermore, the ends of the contact zones 22 that are remote from the basic structure 18 are also connected to the ring structure 27 such that the individual contact zones are spaced apart from one another. The supporting structure 25 thus stabilizes the mechanical structure of the contact zones 22. Of course, the supporting structure 25 can also have a configuration that is different from the illustration of FIG. 3. All that matters is that the mechanical stiffening take place and the spacing of the individual portions of the contacts 9 be preserved in order to prevent electrical short circuits later during the use of the contact spacing converter 4.

In a subsequent method step, the structure that can be seen in FIG. 3 is embedded in a hardening casting compound 28 according to FIG. 4. This casting compound 28 is not electrically conductive. Preferably, synthetic resin can be used as casting compound 28. In order to obtain good thermal characteristics, ceramic particle-filled resins, particularly synthetic resins, are preferably used. The fine, fiber-like electrical paths 10 that are relevant for the abovementioned electrical disentanglement are thus held by the supporting structure 25 on the one hand and also by the casting in hardening casting compound 28 on the other hand, so that they are not bent or damaged during subsequent processes. The preferably frame-like geometry of the supporting structure 25 is preferably always formed at one end of the contact zones that have a finer grid compared to their other ends (coarser grid). During the abovementioned complete casting of the converter zone 15, air inclusions must be avoided—that is, casting is performed so as to be free of voids.

Now, in a subsequent production step according to FIG. 5, after the curing of the casting compound 28, the frame-like area of the supporting structure 25, i.e., the ring structure 27, as well as the basic structure 28 that is also acting as a support and an aid for the build-up are removed. Two parallel front faces 29 and 30 of the casting compound 28 are preferably created. This can be achieved by means of milling and/or grinding processes. The converter zone 15 is now completed, so the converter zone 16 can be built up on it. The converter zone 16 is built up directly on the converter zone 15. This ensures, among other things, that the contact zones 23 of the converter zone 16 to be created connect electrically to the contact zones 22 of the converter zone 15, thus ensuring the conduction of electrical current of the individual paths 10.

As already pointed out, the contact zones 23 of the converter zone 16 are produced through the creation of base parts 20 made of plastic that are subsequently provided with a metallic coating 21. More specifically, a stereolithography method (SLA) or a digital light process rapid prototyping method (DLP) is used for this purpose as an additive production process in order to create the plastic base parts 20. In both of the abovementioned additive processes (SLA and DLP), a liquid or pasty photoactive plastic such as acrylic paint, for example, is used which is crosslinked layer by layer with the aid of radiation, for example laser radiation. The contact zones 23 to be created are built up layer by layer, with this technology enabling the construction of a finer structure than the abovementioned SLM process. Very small angles (<5°) can also be implemented with respect to an X-Y plane—that is, corresponding oblique profiles of the contact zones 23 can be realized in order to perform the disentanglement. The layer-by-layer construction of the electrical paths 10 is thus done through the crosslinking of the plastic, with a supporting structure (not shown) that engages on the end of these paths 10 of the converter zone 16 being preferably built up/concomitantly built up in order to ensure mechanical support. However, in order to achieve electric conductivity in the plastic structures obtained in this way, an additional process step, namely the previously mentioned metallization of the contact zones 23, is necessary. Here, the complete converter zone 16 including the supporting structure that is possibly present is provided with an electrically conductive coating 21. Specifically how that is done will be explained below. While the coating 21 is being produced, it must be ensured that there is no connection between the individual contact zones 23 that might later result in an electrical short circuit. Once the metallization has been carried out, then—as was already described in relation to the converter zone 15—casting is performed with a hardening casting compound 31, and a portion of the casting compound and any supporting structure that was provided are subsequently removed.

The converter zone 17 is now created, namely directly on the converter zone 16. Preferably, a DILL process is used for this purpose—that is, a dip-in laser lithography process that enables especially fine structures and hence a very high resolution to be achieved. In the dip-in laser lithography process (DILL), which is also referred to as two-photon lithography and is also an additive production process, an objective of a laser dips directly into the material to be processed (acrylic paint, for example), which offers the advantage that no interference occurs on boundary surfaces between the different media. Preferably, the objective dips from below into the "hanging" material. As a result, the plastic base parts 20 of the contact zones 24 of the converter zone 17 are now created in turn. Optionally, it is possible to also create a supporting structure (not shown). Only very small volumes of material can be processed using the dip-in laser lithography process, but that does not pose a problem in this area due to the high resolution of the electrical paths 10. The base parts 20 produced in this way are then metallized, i.e., provided with a metallic coating 21. After the casting with casting compound 32 and the removal of areas of the hardened casting compound 32 and, optionally, of portions of the supporting structure, the contact spacing converter 4 is complete.

The contact zones 22, 23, and 24 are connected in series with each other in order to form the complete electrical paths 10 or electrical contacts 9, with disentanglement occurring in each converter zone 15, 16, and 17 through commensurate oblique routing of the electrical paths 10, so that, all in all, there is a transition from a very fine resolution of the contact spacings of the converter zone 17 to a coarse resolution of the contact spacings of the converter zone 15. This configuration can be seen clearly in FIG. 2, with the basic structure 18 or base plate 19 being visible that is to be removed. In the exemplary embodiment of FIG. 2, the basic structure 18 is thus not removed before the creation of the converter zone 16, but rather at a later point in time.

We will now examine the metallization in greater detail. The metallic coating 21 is to be applied to the base parts 20 of the contact zones 23 and 24 that are made of plastic. Insofar as the converter zone 15 also has base parts 20 that are made of plastic, it is necessary to apply the metallic coating 21 here as well. A chemical coating with nickel is preferably considered. This method is also called "electroless deposition." This method is characterized by a very precise casting against the surfaced to be coated. Inhomogeneities do not occur with this method. In order for the reaction that is required for the coating to be able to take place, it is necessary to apply seed to the surface of the plastic base parts 20. Preferably, however, the respective supporting structure is seeded as well and thus also provided with a metallic coating. Such seeding can be achieved by means of a wet chemical process. The relevant commensurate is dipped successively into two different liquids and thus seeded. Palladium seeds are deposited by means of a chemical change reaction on the surface, on which the nickel deposition reaction can then take place. Alternatively to the wet chemical seeding process, plasma coating or sputtering is also conceivable. Due to the complex geometry of the electrical paths 10, however, it must be ensured that no shadow effect occurs, in which areas remain uncoated. The abovementioned chemically deposited nickel layer is preferably a nickel-phosphorous alloy that forms the layer. The phosphorous content can be selected here between 3 to 14%, whereby the electrical and/or mechanical characteristics of the material can be clearly influenced. A person skilled in the art can set the phosphorous content depending the desired outcome. Besides the abovementioned nickel, other metals such as copper and/or gold can also be deposited in a chemical process, thus enabling better electrical characteristics to be achieved in comparison to nickel. It is also conceivable for these other metals, particularly copper and/or gold, to be used in conjunction with a nickel coating.

Alternatively to the purely chemical coating, galvanic (electroplating) processes can also conceivably be used to perform the metallization. For this purpose, an electrically conductive base layer must be applied to the plastic surface of the base parts 20. Here again, chemical processes lend themselves to the application of such a base layer. Accordingly, a combination of an initial chemical coating with subsequent electroplating is used to produce the metallic coating 21.

Figure 6:
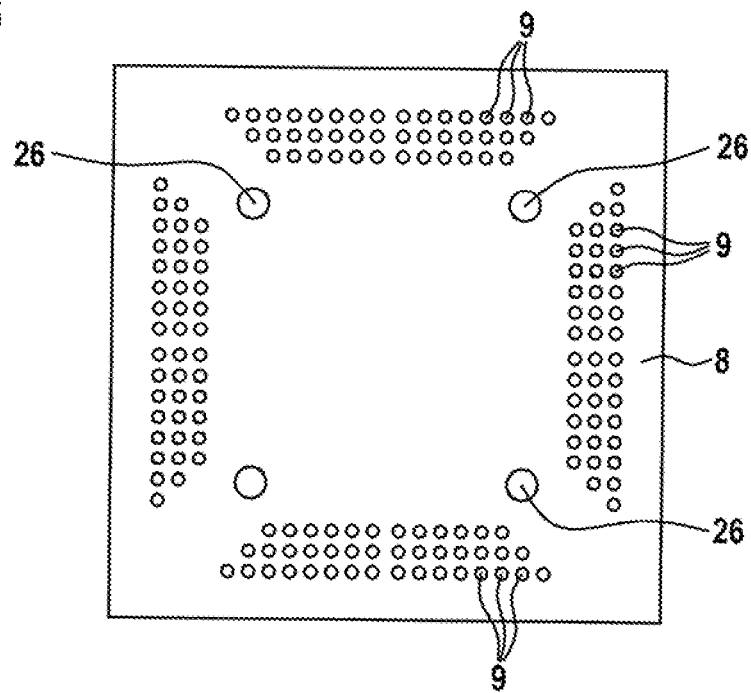
FIGS. 6 and 7 show top views of oppositely situated front faces of the converter zone of the contact spacing converter.
Figure 7:
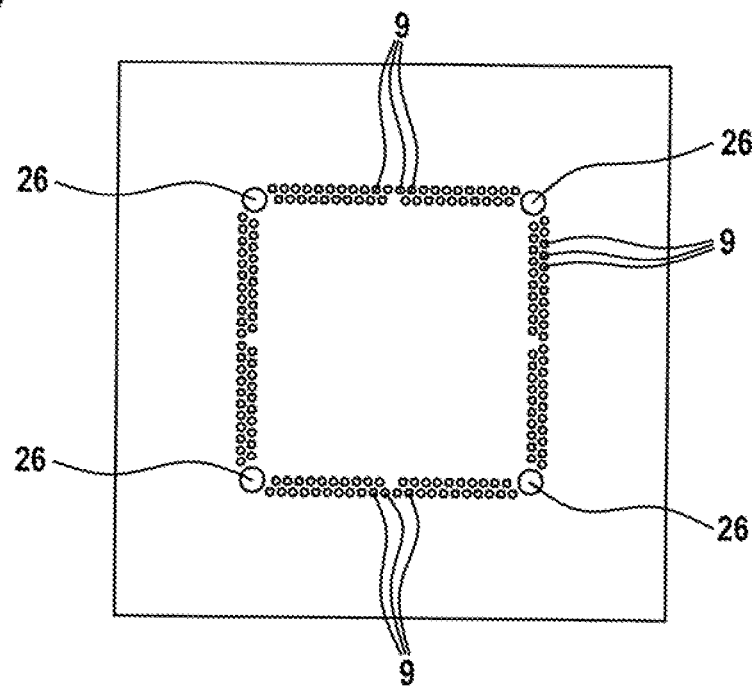

FIGS. 6 and 7 show front views of the converter zone 15 after the removal of the basic structure 18 and areas of the supporting structure 25. It can clearly be seen that the coarse resolution depicted in FIG. 6 of the center distances of the electrical contacts 9 at the opposite end leads to a substantially finer resolution, as can be seen from FIG. 7. Furthermore, FIGS. 6 and 7 also show the supporting columns 26, which are conical, so that their diameters appear smaller in FIG. 7 than in FIG. 6. This slimming-down of the diameters can also be observed at the electrical contacts 9—that is, the electrical contacts 9 diminish in size as the resolution increases, so that very small center distances can be implemented. The disentanglement occurs analogously in the converter zone 16 and again in the converter zone 17.

Figure 8:
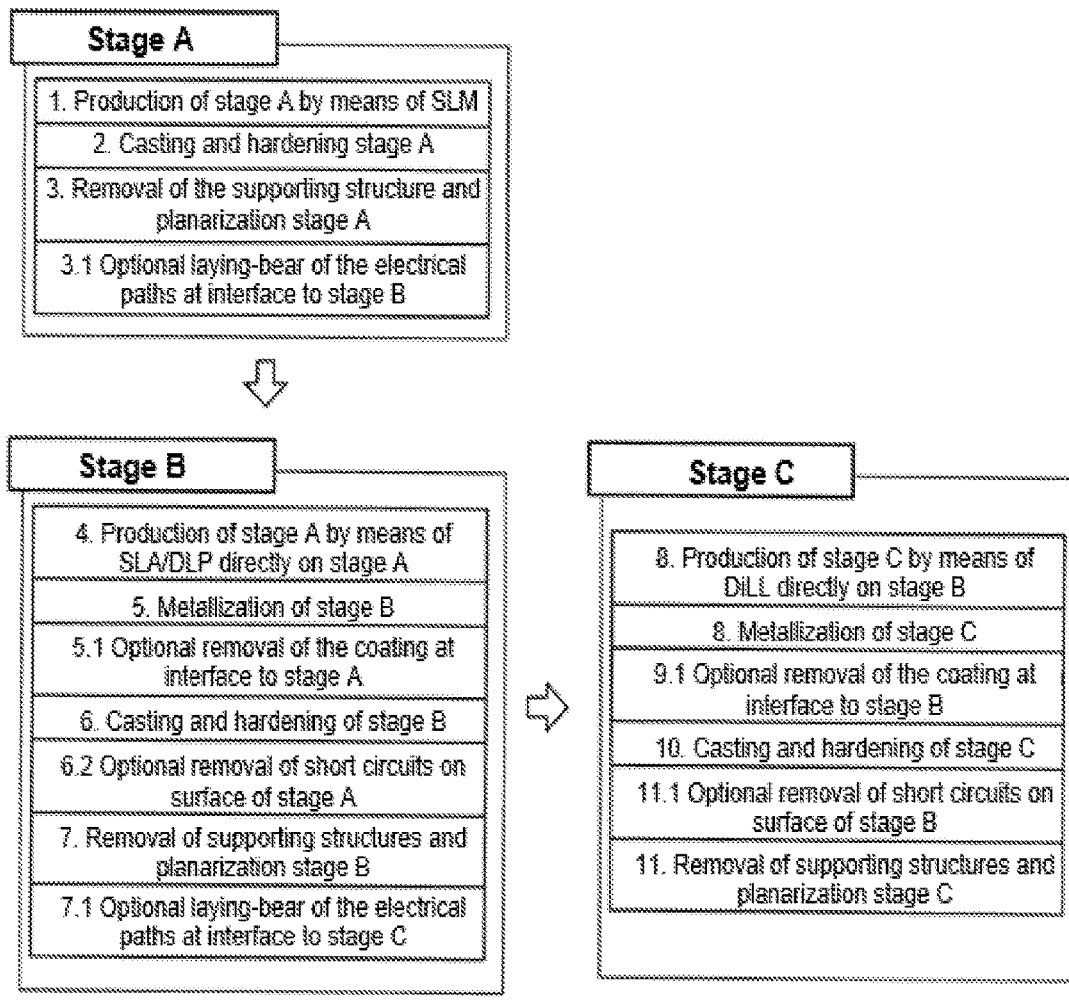
FIG. 8 shows a multipart block diagram clarifying manufacturing stages of a contact spacing converter having three converter zones.

FIG. 8 elucidates the production process of the contact spacing converter 4 in a block diagram, which consists of stages A, B, and C. Stage A corresponds to the production of the converter zone 15, stage B to the production of the converter zone 16, and stage C to the production of the converter zone 17. The details of the various method steps can be found in the text of FIG. 8.

Figure 9:
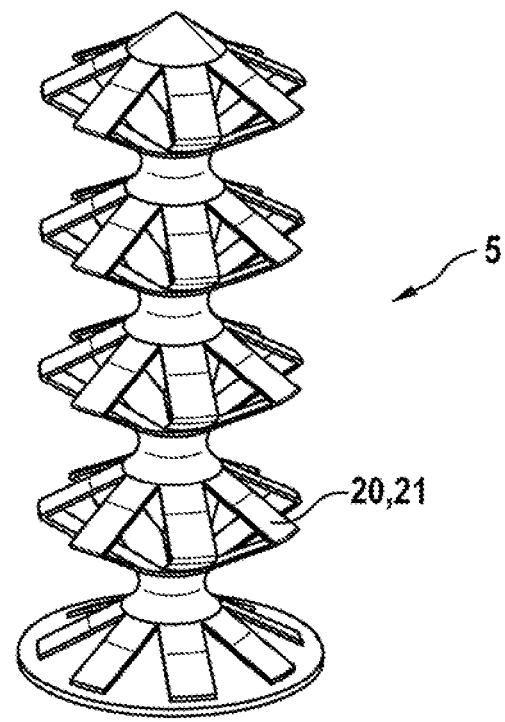
FIGS. 9 to 11 show various spring contacts of the contact spacing converter for the direct electrical touch-contacting of the DUT, particularly wafer.
Figure 10:
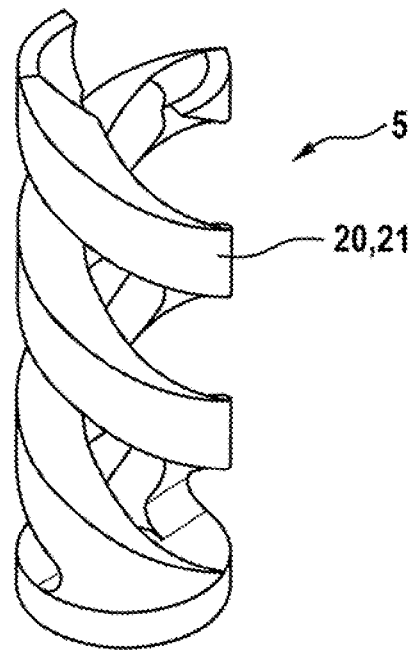
Figure 11:
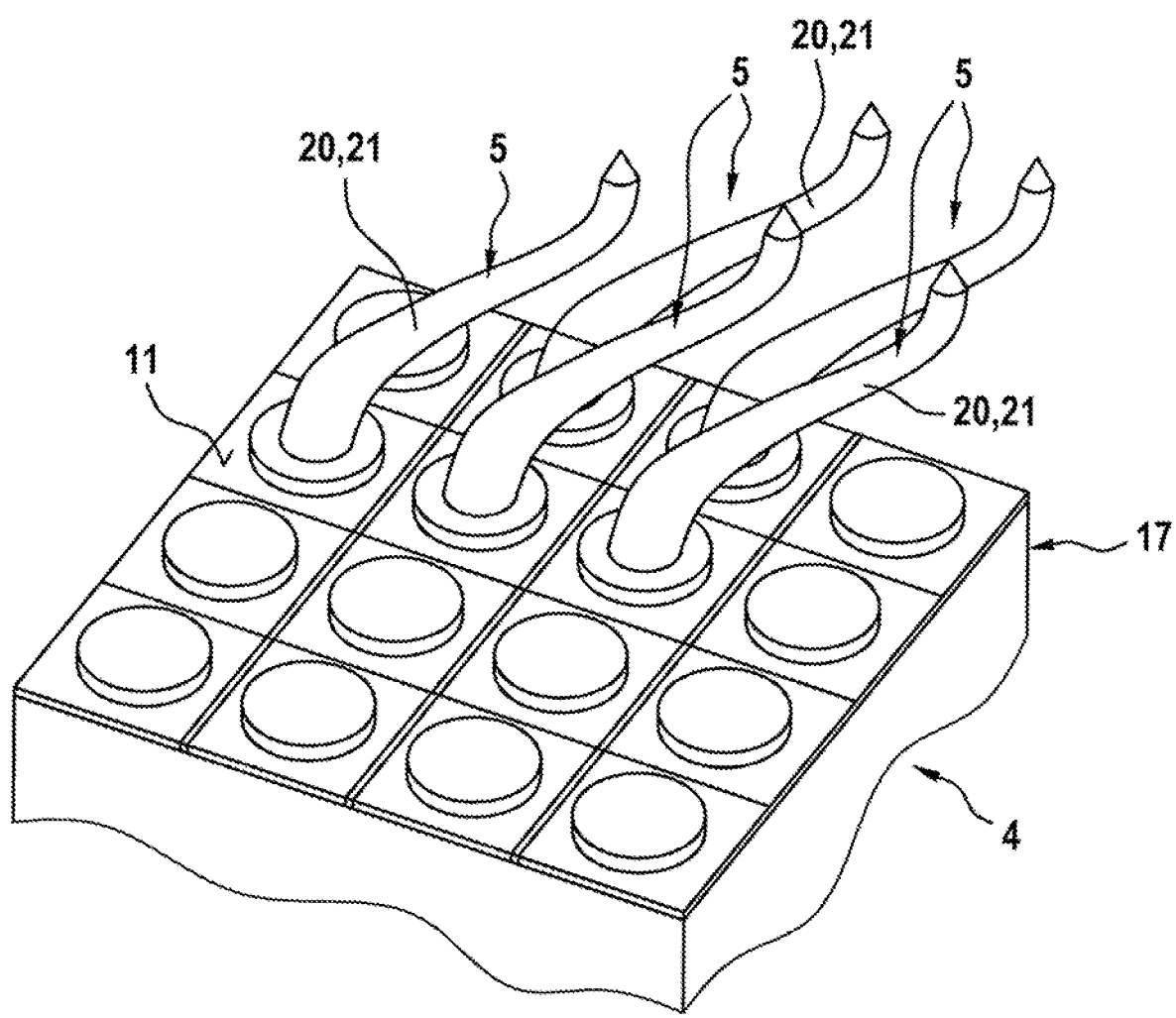

Once the contact spacing converter 4 is completed, then it is necessary to use it according to FIG. 1—that is, the side with the coarse resolution is to be connected to the contact surfaces 12 of the printed circuit board 13, and the side with the finer resolution must be able to be electrically touch-contacted with the DUT 2. The first-mentioned electrical connection can be achieved using known, conventional techniques, for example by means of resilient electrical interconnectors, direct soldering, etc. In order to electrically contact the DUT 2, the abovementioned spring contact pins 5 are preferably used which are preferably also produced by means of an additive production process directly on the corresponding ends of the electrical paths 10 of the contact spacing converter 4. This procedure can of course also be carried out on the other side of the contact spacing converter 4, so that touch-contact occurs between the contact spacing converter 4 and the contact surfaces 12 of the printed circuit board 13. These spring contact pins 5 are structures such as those which can be seen in FIGS. 9, 10, and 11, for example—that is, axially resilient structures that implement electrical touch-contacts in a simple manner. These spring contact pins 5 are connected in a mechanically secure and electrically conductive manner to the corresponding electrical paths 10. These structures of the spring contact pins 5 that follow for the sake of example from FIGS. 9 to 11 are particularly also base parts 20 made of plastic that are produced by means of an additive production process and subsequently provided with a metallic coating 21, so that they are electrically conductive. As regards the production procedure, reference can therefore be made to the above remarks that were made with respect to the creation of the electrical contacts 9. While the spring contact pins 5 of FIGS. 9 and 10 can deflect elastically and axially, the spring contact pins 5 of FIG. 11 are components that have an S-shaped profile over their length and therefore work according to the so-called cantilever principle. Accordingly, they have laterally projecting areas by means of which resilient characteristics are achieved.

Alternatively to the spring contact pin solution as was described above and can be used for the contacting of the DUT 2 and/or the printed circuit board 13, it is also possible to employ known techniques such as, for example, using a contact head that is adjacent to the contact spacing converter 4 and has guide plates that are provided with guide bores in which bending needles are supported in a longitudinally displaceable manner that perform the electrical touch-contacting, or, for example, using a contact head that is adjacent to the contact spacing converter 4 and has guide plates or the like that are provided with boreholes in which spring contact pins are arranged, with these spring contact pins being provided with spring-loaded contact elements, particularly contact plungers that are longitudinally displaceably located in contact sleeves, with these contact elements/contact plungers performing the electrical touch-contacting.

By virtue of the procedure according to the invention, an extremely wide variety of geometries with a very high level of flexibility can be produced from a CAD model through the use of the additive production processes. As a result, customer-specific components can be promptly realized without the need for a tool. Especially in the case of low unit quantities, usually a unit quantity of one, work can thus be performed very economically. The manufacture of the additive components directly from CAD data offers a very high potential for automation. As a result of the inventive possibility of using additive processes to directly create 3D geometries with a high degree of freedom with respect to the design, very short electrical paths can be implemented between the DUT 2 and the printed circuit board 13, thus resulting in very good electrical characteristics. What is more, the automated production and the abovementioned advantages for the production of several identical components also enable identical electrical characteristics to be achieved, which is not the case with the wired components cited as prior art.

The invention claimed is:

1. A method for producing a contact spacing converter in a form of a space transformer having electrical contacts that form electrical paths and in which a first contact spacing of the electrical contacts is converted into a comparatively different, second contact spacing of the electrical contacts, the method comprising:

creating a plurality of base parts including at least one respective base part for at least several of the electrical contacts, with at least a portion of each base part being made of plastic, and subsequent metallization of at least the portion of each base part that is made of plastic to form the electrical paths, wherein production of the portion of each base part that is made of plastic is performed through an additive production process.

2. The method of claim 1, wherein the additive production process is selected from a group consisting of a stereolithography process (SLA), a digital light process rapid prototyping method (DLP), a dip-in laser lithography process (DILL), and combinations thereof.

3. The method of claim 1, wherein the metallization is performed using at least one galvanic and/or chemical process.

4. The method of claim 1, wherein an entirety of each base part is made of plastic, by the additive production process, as a one-piece base part.

5. The method of claim 1, further comprising metallizing an entirety of each base part.

6. The method of claim 3, wherein the metallization is galvanic metallization and before the galvanic metallization, an electrically conductive starting layer is applied to at least the portion of each base part that is made of plastic or produced on a surface of the portion.

7. The method of claim 1, wherein, before metallization, a seed layer is applied to at least the portion of each base part that is made of plastic, by a dipping or plasma process, or produced on a surface of the portion.

8. The method of claim 1, further comprising creating a metallic coating by metallization.

9. The method of claim 8, further comprising creating at least one opening in the metallic coating and allowing pyrolysis products to escape through the at least one opening during at least one process selected from a group consisting of a pyrolysis process, a wet chemical process, and a dry chemical process.

10. The method of claim 1, wherein the contact spacing converter is composed of several converter zones, with the electrical contacts each being composed of several contact zones, each contact zone belonging to a converter zone, with the at least one base part being produced and subsequently metallized in order to produce at least one contact zone of at least one of the converter zones.

11. The method of claim 10, wherein the contact spacing of the contacts at one end of each contact zone is created so as to have a different spacing interval than the contact spacing of the contacts at another end of this contact zone.

12. The method of claim 10, further comprising applying the additive production process to at least one of the contact zones during manufacturing.

13. The method of claim 10, wherein, during the production of the electrical contacts that are composed of several contact zones, each of the contact zones of each contact is produced by another of the additive production process.

14. The method of claim 10, wherein, in an intermediate method step, at least one of the converter zones is produced with a supporting structure that stabilizes the respective contact zones of the contacts.

15. The method of claim 14, wherein the supporting structure is created by additive production processes, together with the contact zones.

16. The method as of claim 14, wherein the ends of the electrical contacts of the contact zone are provided with the supporting structure.

17. The method of claim 10, wherein at least one of the converter zones is embedded in electrically nonconductive casting compound.

18. The method of claim 17, wherein, through removal of a portion of the casting compound, the ends of the contact zones of the respective contacts are laid bare to create exposed contact zones, after removal of at least a portion of a supporting structure.

19. The method of claim 18, wherein, after the removal of the portion of the casting compound, at least one additional converter zone is created on the ends of the exposed contact zones.

20. The method of claim 1, further comprising creating a metal shell by removing the portion of each base part made of plastic.

21. The method of claim 20, further comprising creating at least one opening in the metal shell and allowing pyrolysis products to escape through the at least one opening during at least one process selected from a group consisting of a pyrolysis process, a wet chemical process, and a dry chemical process.

* * * * *